US009664740B2

(12) United States Patent
Shrivastava

(10) Patent No.: US 9,664,740 B2
(45) Date of Patent: May 30, 2017

(54) SYSTEMS AND METHODS FOR TESTING CIRCUITRY PROGRAMMABILITY

(75) Inventor: Ayaskant Shrivastava, Plano, TX (US)

(73) Assignee: QUALCOMM Incorporated, San Diego, CA (US)

( * ) Notice: Subject to any disclaimer, the term of this patent is extended or adjusted under 35 U.S.C. 154(b) by 1367 days.

(21) Appl. No.: 13/309,336

(22) Filed: Dec. 1, 2011

(65) Prior Publication Data

US 2013/0144544 A1 Jun. 6, 2013

(51) Int. Cl.
*G01F 19/00* (2006.01)
*G01R 31/3185* (2006.01)
*G01R 19/00* (2006.01)

(52) U.S. Cl.
CPC .. *G01R 31/318516* (2013.01); *G01R 19/0084* (2013.01)

(58) Field of Classification Search
CPC ............. G01R 19/0084; G01R 31/318516
USPC ............. 702/58; 324/73.1, 522, 750.01
See application file for complete search history.

(56) References Cited

U.S. PATENT DOCUMENTS

| 5,854,719 | A | * | 12/1998 | Ginosar et al. | 360/69 |
| 5,880,993 | A | * | 3/1999 | Kramer et al. | 365/185.22 |
| 6,144,526 | A | * | 11/2000 | Ginosar et al. | 360/133 |
| 2004/0042293 | A1 | * | 3/2004 | Ogino | 365/202 |
| 2006/0149491 | A1 | * | 7/2006 | Flach et al. | 702/107 |
| 2006/0210850 | A1 | * | 9/2006 | Abouatallah et al. | 429/22 |
| 2009/0022013 | A1 | * | 1/2009 | Shirotori et al. | 368/10 |
| 2010/0134132 | A1 | * | 6/2010 | Price et al. | 324/763 |

OTHER PUBLICATIONS

Search Report issued for United Kingdom Patent Application No. 1221545.5, dated Mar. 27, 2013, 1 page.

* cited by examiner

*Primary Examiner* — John Breene
*Assistant Examiner* — Yaritza H Perez Bermudez
(74) *Attorney, Agent, or Firm* — Chui-kiu Teresa Wong; Kenneth Vu

(57) ABSTRACT

Systems and methods in which circuitry programmability is tested through observing a change in voltage on a circuit node that is affected by the programmability under test. For example, one or more particular circuit node may be identified at which some measurable change in voltage occurs upon a change in state of a programmable circuit under test (PCUT). Thus, by detecting a change in voltage at such a circuit node in association with a programmable state change, embodiments may determine that respective circuit programmability is functional. Test circuitry of embodiments provides for circuitry programmability testing, through observing a change in voltage on a circuit node that is affected by the programmability under test, suitable for testing digital programmability which is deeply embedded in analog circuitry.

33 Claims, 3 Drawing Sheets

SYSTEMS AND METHODS FOR TESTING CIRCUITRY PROGRAMMABILITY

TECHNICAL FIELD

The present invention relates generally to circuitry testing functionality and, more particularly, to testing circuitry programmability.

BACKGROUND OF THE INVENTION

The state of electronics has advanced to a point in which various, often complex features are implemented by a particular circuit configuration. For example, the integrated circuits forming various consumer and professional devices, such as cellular telephones, smart phones, personal digital assistants (PDAs), tablet devices, computer systems, video displays, televisions, set top boxes, digital video recorders, network devices, etc., are often adapted to not only implement robust features but may implement a plurality of different features.

Various programmability may be provided in the circuit implementation to facilitate configuring of features and/or selection of particular features available using the circuitry. Such programmability may be provided in an integrated circuit configuration, such as a relatively large scale integrated circuit, to accommodate for process-voltage-temperature (PVT) variations and/or for debugging purposes. As another example, a particular integrated circuit configuration may utilize digitally programmable analog blocks (e.g., analog circuits that perform functions such as automatic gain control, band selection, filter pole re-adjustment, temperature compensation, etc.), whereby a digital block implementing the digital programmability facilitate adjustment of one or more corresponding analog blocks.

Although such programmability may be desirable in providing flexibility with respect to the functionality provided, implementing such programmability within various circuitry is not without difficulty. For example, circuit operation in each of the different states enabled by the programmability must often be tested in order for the circuitry and/or resulting device to comply with delivery requirements or other demands. As more and more programmability is introduced to the various circuits, the problem of testing the circuits grows exponentially.

Testing techniques have been developed to provide at least some level of testing with respect to the programmability of circuitry. For example, in post silicon testing commonly in use today the purely digital blocks of the circuitry are tested using a scan chain whereby every flip-flop of the digital block is programmed into a certain state, the functional mode is run for one cycle using a simple scan input test pattern, and the outputs of the scan chain observed. The scan chain testing technique is operable without actually entering the functional mode of the circuitry under test, and thus may be performed in a separate test mode. Although such a scan chain provides a relatively fast testing technique, whereby simple test patterns may be utilized to detect stuck faults with respect to digital circuitry, such a scan chain testing technique is not ideal for all circuit configurations. For example, circuitry in which a full scan design cannot be implemented (e.g., circuitry having sequential circuits, such as memory elements that are not part of the scan chain) require sequential pattern generation for testing resulting in more complex and time consuming testing. Moreover, the scan chain testing technique can only be implemented through a purely digital circuit. When the circuitry under test comprises a digital block which is deeply embedded inside an analog block, the use of a scan chain becomes problematic if not impossible.

In an attempt to address the foregoing issues with the scan chain technique, a testing technique referred to a boundary scan has been used. In the boundary scan technique, special flip-flops which only activate during the test mode are placed so as to dispose a part of the digital logic (e.g., a digital logic element of the sequential or embedded digital block) inside of those two flip-flops. In operation, the boundary scan thus measures the stuck faults using a sensor configuration disposed inside of the circuitry under test. However, the introduction of such a boundary testing configuration is only possible for non-sensitive and non-critical nodes where adding an additional flip-flop and the associated loading is not an issue with respect to the normal, non-test mode operation of the circuit under test. Moreover, a boundary test implementation is not possible with respect to all circuit configurations.

A testing technique that might be implemented, such as with respect to a circuit node sensitive to the addition of a boundary scan flip-flop configuration, is to provide circuit node as a test point directly to the tester. In such a technique, all of the sequencing and capturing of output is performed outside of the circuit under test (i.e., by the tester). Assuming that the tester is equipped with a suitably high resolution analog to digital converter (ADC), this test point scan technique may provide desired testing of the circuit under test. However, such a test point implementation is very likely to introduce ground noise. The introduction of such ground noise would require multiple samples to be captured for averaging, thereby requiring longer testing times. Moreover, since a larger out of circuit load must be charged, each sample capture would be slower.

From the above, it can be appreciated that not all circuitry is well suited for, or compatible with, implementation of existing testing techniques such as scan chain, boundary scan, or test point scan. Such circuitry may nevertheless be tested with a functional test, wherein the full operational mode of each functionality is tested (e.g., full sweep of all signals or operational situations). For example, attenuation settings can be tested by providing radio frequency (RF) input throughout the operating bandwidth of the circuit and checking output power through the full signal chain. However, such functional tests are also typically not ideal. In particular, it is generally expensive and very time consuming to perform a full functional test of circuitry, particularly if a functional mode must be implemented in order to test just for logical errors in the programmability. Moreover, some minor programmability (e.g., bias current control) may not have any significant change in output parameter and thus the programmability may not be observable at all using a functional test.

BRIEF SUMMARY OF THE INVENTION

The present invention is directed to systems and methods in which circuitry programmability is tested through observing a change in voltage on a circuit node that is affected by the programmability under test. For example, one or more particular circuit node may be identified at which some measurable change in voltage occurs upon a change in state of a programmable circuit under test (PCUT). Thus, by detecting a change in voltage at such a circuit node in association with a programmable state change, embodiments of the invention may determine that respective circuit programmability is functional. Likewise, by failing to detect a change in voltage at the circuit node in association with the programmable state change, embodiments may determine that the respective circuit programmability is non-functional.

In operation according to embodiments of the invention, probe circuitry (referred to herein as delta probe circuitry or a delta probe) is implemented to detect a difference in voltage on a circuit node (referred to herein as a delta node) in association with a plurality of programmability states. The delta probes of embodiments are adapted to detect relatively small voltage movements on a delta node, while accommodating a relatively large range of delta node voltages. Such delta probe circuitry may be coupled directly to a delta node or may be multiplexed or otherwise switchably coupled to one or more delta nodes.

From the foregoing it can be appreciated that a method implemented according to embodiments herein may include identifying a node (e.g., the aforementioned delta node) whose voltage changes with programmability of one or more PCUT. Often such a node is native within the PCUT circuitry or circuitry associated therewith, and therefore may be identified by simulation and/or empirical analysis. If, however, such a node is not natively present, a test mode may be created that enables a node to reflect a suitable voltage change on a case by case basis. A probe (e.g., the aforementioned delta probe) is coupled to the node for detecting voltage differences experienced by the node. Thereafter, the programmability of the PCUT may be tested by controlling the PCUT to change between programmable states and using the probe to capture the voltage difference at the node as between the programmable states. Such captured voltage differences are utilized according to embodiments of the invention to determine if a particular programmability of the PCUT is functional.

Embodiments of the invention couple the aforementioned delta probe, providing programmability state change voltage differences, to circuitry adapted for determining the functional status of the particular PCUT. For example, a delta probe herein may provide an analog voltage difference to an ADC and/or a test controller. The ADC may operate to convert the analog voltage difference detected by the delta probe in association with a change in programmable state of the PCUT to a digital signal. The test controller may analyze the digital signal to determine that a change in voltage was detected by the delta probe, and thus that a change in programmable state of the PCUT has occurred. For example, if no change voltage is observed where simulation or empirical testing of a properly functioning indicates that a change in voltage at the delta node should be present, an error is flagged by the test controller of embodiments of the invention. It should be appreciated that the foregoing operation eliminates the need for functional test sweeping of the programmabilities of the PCUT being tested.

In addition to providing a determination that a change in voltage was or was not detected, and thus the programmability is or is not functional, the test controller of embodiments may control the programmable state change of the PCUT, control the delta probe to detect the voltage difference, and otherwise operate to control PCUT testing operation herein. For example, the test controller of embodiments may comprise a digital state machine operable to control the delta probe timing in sync with changing the programmability, capture the output thereof, and provide information indicating success or failure of the programmability state change.

The changes in voltage associated with a change in state of a particular programmability of a PCUT can often be very small. Accordingly, a delta probe of embodiments is adapted to accommodate the such small voltage changes while facilitating determining the operability of PCUT programmability. For example, delta probes of embodiments herein implement a difference and gain stage configuration which facilitate the detection of such small voltage changes. In particular, delta probes implementing embodiments of a difference and gain stage configuration enable the measurement of small voltage changes by even a moderate/low resolution ADC, such as may be built with a relatively small footprint.

Embodiments of the invention may be implemented using circuitry partially or even entirely included in a same integrated circuit substrate as that of the PCUT. For example, embodiments of the aforementioned delta probe are adapted for disposing in a same integrated circuit substrate as the PCUT. In particular, delta probe configurations of embodiments herein comprise relatively few components which are readily disposed on-chip in association with an integrated circuit including one or more PCUT to be tested. Additionally, embodiments implement the aforementioned ADC in the integrated circuit substrate hosting the PCUT. In particular, the operation of delta probes herein to provide voltage difference information is utilized to reduce the dynamic range of the signals to be analyzed in determining the operability of the programmable state change of the PCUT. Accordingly, the aforementioned moderate/low resolution ADCs which are readily disposed in the same integrated circuit substrate as the PCUT, without requiring objectionable area and/or rendering the overall integrated circuit too complex, may be utilized. Moreover, the aforementioned test controller may be implemented in the integrated circuit substrate hosting the PCUT to thereby provide an embodiment which is entirely included in a same integrated circuit substrate as that of the PCUT. The test controller may, for example, be implemented as a relatively simple digital state machine operable to control the delta probe, capture the voltage change output information, and provide error flagging when a voltage change is not detected in association with a particular programmability state change control.

From the foregoing, it should be appreciated that embodiments of delta probes herein provide for circuitry programmability testing, through observing a change in voltage on a circuit node that is affected by the programmability under test, suitable for testing digital programmability which is deeply embedded in analog circuitry. The testing need not sweep the full operational mode of the analog functionality tested. Moreover, since the testing of embodiments is done on chip, it requires minimal intervention with tester and therefore decreases test time/and or allowing for parallel testing, thus decreasing test-costs significantly. Use of the delta probe design for test of embodiments can enable significantly more coverage than that was feasible before with a functional test alone. For example, completely on-chip embodiments of delta probe design for test circuits herein facilitate disposing multiple such test circuits in an integrated circuit facilitating more coverage, parallel testing, etc.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION OF THE INVENTION

Figure 1:
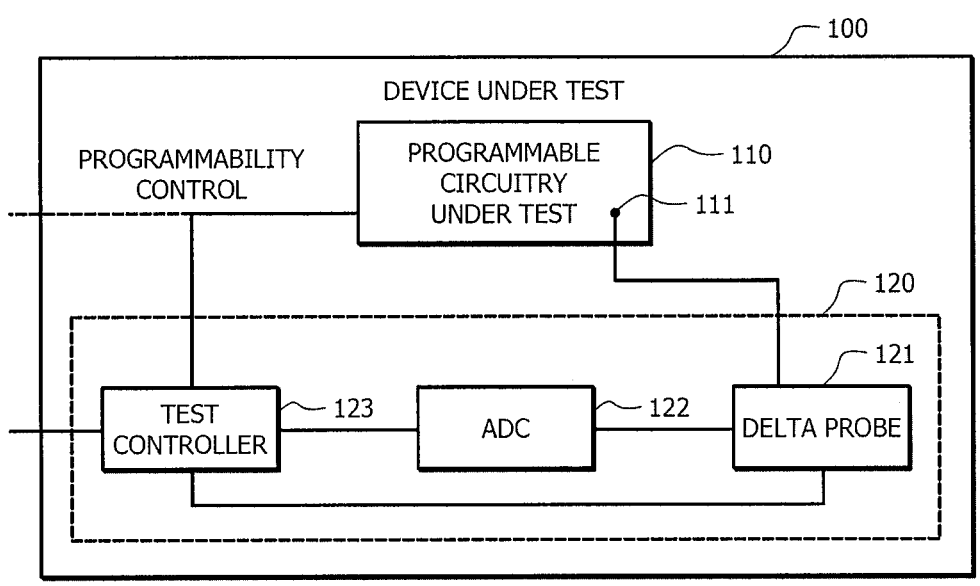
FIG. 1 shows an embodiment of delta test circuitry as may be utilized in testing with respect to a programmable circuit under test.

FIG. 1 shows a device as may be provided testing using testing circuitry adapted according to embodiments of the invention. In particular, FIG. 1 shows device under test (DUT) 100 which may comprise one or more programmable circuit (shown here as programmable circuitry under test (PCUT) 110) for which testing is provided according to the concepts herein by delta test circuitry 120. DUT 100 may, for example, comprise an integrated circuit used in various consumer and professional devices, such as cellular telephones, smart phones, PDAs, tablet devices, computer systems, video displays, televisions, set top boxes, digital video recorders, network devices, etc., having programmability to facilitate configuring of features and/or selection of particular features available using the circuitry. Such programmability may utilize digitally programmable analog blocks (e.g., analog circuits that perform functions such as automatic gain control, band selection, filter pole re-adjustment, temperature compensation, etc.), whereby a digital block implementing the digital programmability facilitate adjustment of one or more corresponding analog blocks. Accordingly, PCUT 110 of embodiments may comprise digitally controlled programmability deeply embedded in analog circuitry.

In an embodiment adapted to provide testing of such digitally controlled programmability embedded in analog circuitry, without sweeping the full operational mode of the analog functionality tested, the illustrated embodiment of delta test circuitry 120 implements probe circuitry (shown here as delta probe 121) to detect a difference in voltage (e.g., DC voltage) in association with a plurality of programmability states of PCUT 110 on a circuit node (shown here as delta node 111) thereof. That is, delta probe 121 of embodiments is adapted to capture a voltage difference, as presented at delta node 111, associated with a change in programmability state of PCUT 110. Such a change in voltage is used in determining the operability of the programmability, or some portion thereof, of PCUT 110.

In configuring delta test circuitry 120 to provide testing of PCUT programmability according to embodiments of the invention, identification of a node whose voltage changes with programmability of one or more PCUT is preferably identified as a delta node (e.g., delta node 111). For example, delta node 111 may be identified through simulation and/or empirical analysis of PCUT 110, such as where PCUT 110 includes a suitable node native within the PCUT circuitry. Alternatively, a test mode may be created that enables a node to be identified as delta node 111 to reflect a suitable voltage change if such a node is not natively present in PCUT 110.

Delta probe 120 of the illustrated embodiment is coupled to delta node 111 for detecting voltage differences experienced by the node. It should be appreciated that embodiments of delta test circuitry may be adapted to provide testing of a plurality of different programmabilities. For example, although delta probe 121 of the illustrated embodiment is shown coupled to a single delta node (delta node 111), embodiments of delta probe 121 may be coupled to a plurality of delta nodes (e.g., using a multiplexed or switchable interface), each associated with different programmabilities of the PCUT and/or different PCUTs, to provide testing of a plurality of different programmabilities. Accordingly, a plurality of delta nodes can be multiplexed and to one delta probe and one test controller can provide testing for the programmabilities associated with each such delta node.

In operation according to embodiments of the invention, the programmability of the PCUT is tested by controlling the PCUT to change between programmable states and using delta probe 121 to capture the voltage difference at the node as between the programmable states. Such captured voltage differences are utilized according to embodiments of the invention to determine if a particular programmability of PCUT 110 is functional. Accordingly, the embodiment of delta test circuitry 120 illustrated in FIG. 1 includes ADC 122 and test controller 123 adapted for determining the functional status of the particular PCUT.

Delta probe 111 of embodiments operates to provide an analog voltage difference detected in association with a change in programmable state of PCUT 110 to ADC 122. ADC 122 of embodiments operates in turn to convert the analog voltage difference detected by delta probe 121 to a digital signal for providing to test controller 123. Test controller 123 of embodiments operates to analyze the digital signal to determine that a change in voltage was detected by delta probe 121, and thus that a change in programmable state of PCUT 110 has occurred. For example, if no change voltage is observed (e.g., a "stuck fault" exists with respect to the particular programmability) where simulation or empirical testing of a properly functioning indicates that a change in voltage at delta node 111 should be present, an error is flagged by test controller 123.

It should be appreciated that test controller 123 of embodiments need not analyze the magnitude of the change in voltage detected by delta probe 121, but rather that a change in voltage was detected at delta node 111 in association with a change in the programmable state of PCUT 110. Alternative embodiments of the invention, however, may utilize voltage change magnitude information, such as to verify not only that a change in voltage was detected but that a change in voltage (e.g., above or below a predetermined threshold) indicative of the particular change in the programmable state of PCUT 110 was detected. Irrespective of whether test controller 123 of embodiments bases programmability functionality determinations upon detection of a voltage difference or utilizes additional information, such as the aforementioned magnitude information, it should be appreciated that the foregoing operation eliminates the need for functional test sweeping of the programmabilites of PCUT 110.

In addition to providing a determination that a change in voltage was or was not detected, and thus the programmability is or is not functional, test controller 123 of the illustrated embodiment controls the programmable state change of PCUT 110 and thus is shown in communication therewith. Test controller 123 of embodiments also provides control with respect to delta probe 121 to capture the voltage difference and thus is shown in the illustrated embodiment in control communication with delta probe 121.

Figure 2:
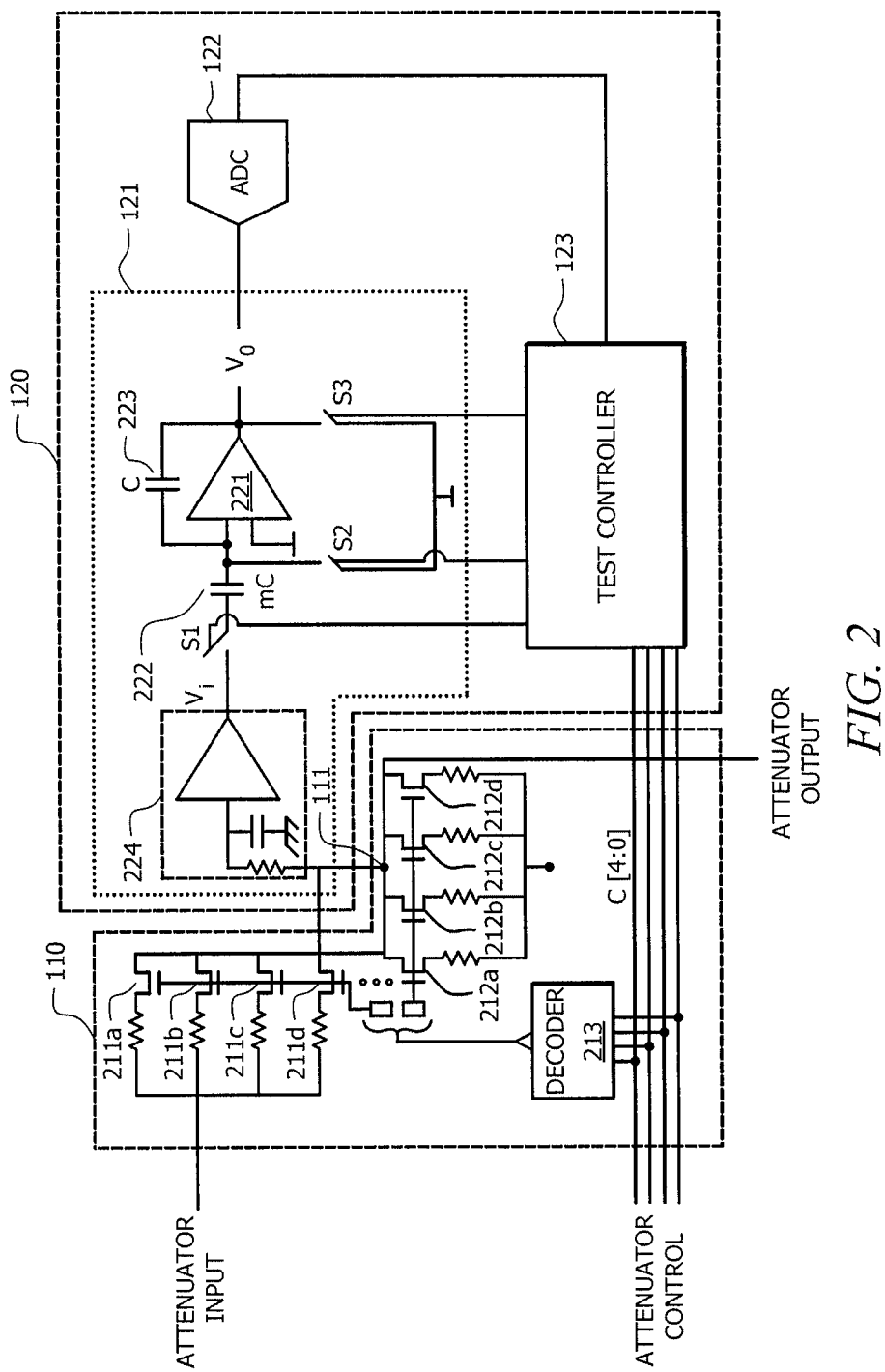
FIG. 2 shows detail with respect to embodiments of delta test circuitry herein.

Directing attention to FIG. 2, additional detail with respect to delta test circuitry 120 of embodiments of the present invention is shown. Although the particular configuration of PCUT 110 is somewhat immaterial to the implementation of delta test circuit 120 of embodiments, detail with respect to an exemplary configuration of PCUT 110 is shown in FIG. 2 to facilitate an understanding of the concepts herein. The configuration of PCUT 110 illustrated in FIG. 2 comprises a digitally controlled variable attenuator in which a plurality of series field effect transistors (FETs) (shown as FETs 211) and a plurality of shunt FETs (shown as FETs 212) are controlled by applying an attenuator control signal to decoder 213 to select an amount of attenuation to apply to a signal passed through the variable attenuator. Accordingly, the exemplary configuration of PCUT 110 provides digitally controlled programmability embedded in analog circuitry.

Test controller 123 shown in FIG. 2 may comprise a digital state machine operable to control the timing of delta probe 121 in sync with changing the programmability of PCUT 110. The difference and gain stage of delta probe 121 comprises sampling capacitors 222 and 223 (e.g., preferably related by a gain factor m, such that a value of sampling capacitor 223 is C and a value of sampling capacitor 222 is mC) and amplifier 221 (e.g., operational amplifier). This circuitry of the difference and gain stage of delta probe 121, is controlled (e.g., using switches S1-S3) to capture a voltage difference associated with the change in programmability state of PCUT 110 and to amplify this captured voltage difference by the gain factor (m). The voltage difference captured and amplified by delta probe 121 (e.g., Vo) is provided to ADC 122 for conversion to a digital signal. This digital signal is provided to test controller 123 of the illustrated embodiment for a determination of success or failure of the programmability state change.

Figure 3:
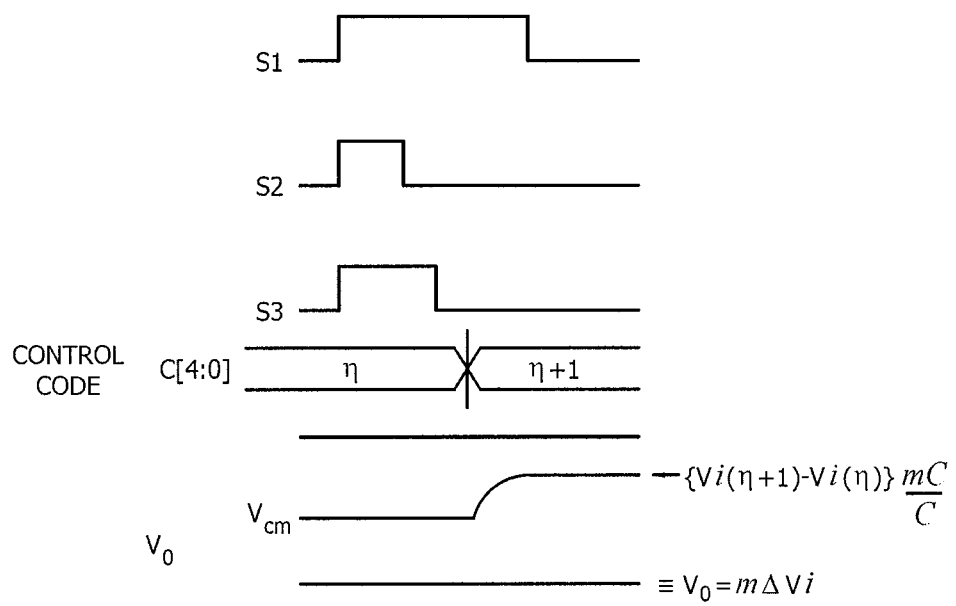
FIG. 3 shows a timing diagram of operation of components of delta test circuitry of embodiments herein.

By appropriately sequencing switches S1, S2, and S3 of delta probe 121, such as under control of test controller 123, the consecutive difference of Vin(n) and Vin(n+1) can be captured. Such sequencing according to embodiments of the invention is represented in the timing diagram of FIG. 3. As shown in FIG. 3, during time period n (while the control code for a first programmability state of PCUT 110 is provided by test controller 123) the switches S1, S2, and S3 are all closed. The voltage present on delta node 111 identified in PCUT 110 is sampled onto sampling capacitor 222, such as through buffer 224 (e.g., included to provide isolation of delta node 111 from circuitry of delta test circuitry 120). After sufficient time for sampling capacitor 222 to have captured the voltage of delta node 111, S2 is opened followed shortly thereafter by S3. Accordingly, at this point the virtual ground of the difference and gain stage of delta probe 121 is at virtual ground and all nodes thereof are at steady state. Thereafter, test controller 123 changes the state of the programmability of PCUT 110 during time period n+1 (e.g., using the control code for a second programmability state of PCUT 110) thereby changing the voltage at delta node 111 from Vi(n) to Vi(n+1). The difference in voltage appears at the virtual ground of the difference and gain stage of delta probe 121 and amplifier 221 forces the output voltage (Vo) up such that charge (e.g., {Vi(n+1)−Vi(n)}*mC) is transferred onto sampling capacitor 223. This results in amplifier 221 producing the voltage difference between Vi(n+1) and Vi amplified by the gain factor m at the output of delta probe 121 (i.e., Vo=(Vi(n+1)−Vi(n)*m).

From the foregoing it can be appreciated that, in operation according to embodiments of the invention, delta probe 121 performs a difference operation with respect to consecutive input voltages (e.g., Vi(n), Vi(n+1), etc.) in the analog domain. Accordingly, ADC 122 of the illustrated embodiment need not be configured as a high resolution ADC operable to convert both input voltages themselves (e.g., Vi(n) and Vi(n+1)).

It should be appreciated that the changes in voltage associated with a change in state of a particular programmability of a PCUT can often be very small. Accordingly, delta probes of embodiments are adapted to accommodate such small voltage changes while facilitating determining the operability of PCUT programmability. Delta probes of embodiments are preferably operable to detect relatively small voltage movements (e.g., tenths or even hundredths of a volt) on a delta node, while accommodating a relatively large range of delta node voltages (e.g., a dynamic range encompassing voltages of different orders of magnitude). For example, delta probe 121 of the embodiments described above implements a difference and gain stage configuration which facilitates the detection of such small voltage changes by essentially cancelling out the DC voltage magnitude of the signal at the delta node. In addition to performing the difference operation in analog domain, delta probe 121 of embodiments provides a gain of m to the captured voltage difference, thereby relaxing the least significant bit (LSB) requirements of ADC 122.

The resolution requirements on ADC 122 of embodiments of the invention may thus be relaxed significantly. Accordingly, a moderate/low resolution ADC (e.g., 7 or 8 bit ADC) may be utilized as ADC 122 according to embodiments herein. Such embodiments enable a small footprint medium/low resolution ADC to be utilized in a "for test" only circuit (e.g., delta test circuitry 120. Of course, where an ADC (whether high/medium/low resolution) is present in the DUT, embodiments of the invention may utilize that ADC in providing testing of one or more PCUT in accordance with the concepts herein.

From the above it can be appreciated that embodiments of delta test circuitry of the invention may be implemented using circuitry partially or even entirely included in a same integrated circuit substrate as that of the PCUT (i.e., a partial or complete "on-chip" embodiment). Accordingly, embodiments of delta probes herein may be adapted for disposing in a same integrated circuit substrate as the PCUT. For example, delta probe 121 of the embodiment shown in FIG. 3 comprises relatively few components (e.g., a relatively simple operational amplifier (OP-amp) difference and gain stage configuration) which is readily disposed on-chip in association with PCUT 110. Additionally, embodiments implement the aforementioned ADC in the integrated circuit substrate hosting the PCUT. For example, the operation of delta probe 121 of embodiments discussed above provides voltage difference information having a relatively small dynamic range. Accordingly, ADC 122 may comprise a moderate/low resolution ADCs (e.g., 8 bit ADCs) which is readily disposed on-chip, without requiring objectionable area and/or rendering the overall integrated circuit too complex. Moreover, a test controller of delta test circuitry herein may be implemented in the integrated circuit substrate hosting the PCUT to thereby provide an complete on-chip embodiment. For example, test controller 123 may be implemented as a relatively simple digital state machine operable to control delta probe 121 in sync with programmable states of PCUT 110, capture the digital voltage change output information provided by ADC 122, and provide error flagging when a voltage change is not detected in association with a particular programmability state change control. Such on-chip embodiments not only provide for testing without the need to interface external testing apparatus to the PCUT, but may also provide improved results because the effects of off-chip board noise is eliminated.

The use of delta test circuitry of embodiments can enable significantly more coverage than is feasible with a functional test as traditionally used. For example, the delta test circuitry use of a delta node (e.g., an end summing node) provides testing of the digital programmability circuitry up to that node (e.g., even the defects in the switches are covered). Moreover, completely on-chip embodiments of delta probe design for test circuits herein facilitate disposing multiple such test circuits in an integrated circuit facilitating more coverage, parallel testing, etc. Additionally, the testing performed by operation of delta test circuitry of embodiments is relatively fast (e.g., for a 12 bit programmability (4096)× 10 such different bits, using a 1 mega-samples per second (MSPS) ADC it takes only approximately 80 mS of test time), thereby facilitating rapid testing even where sequential tests are performed (e.g., multiple multiplexed delta nodes).

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
controlling a programmable circuit under test (PCUT) to change from a first state of programmability with a first control code to a second state of programmability with a second control code;
capturing in synchronization with the PCUT changing from the first state of programmability to the second state of programmability a voltage difference experienced at a delta node of the PCUT with a delta probe circuit; and
determining operability of at least a portion of the PCUT based upon information regarding the captured voltage difference,
wherein the delta probe circuit comprises:
an amplifier having a first input terminal, a second input terminal connected to a reference voltage, and an output terminal;
a first capacitor having a first terminal selectively coupled between the delta node of the PCUT and an open circuit by a switch, and a second terminal coupled to the first input terminal of the amplifier; and
a second capacitor having a first terminal coupled to the first input terminal of the amplifier and a second terminal coupled to the output terminal of the amplifier, and
wherein the first input terminal of the amplifier and the output terminal of the amplifier are selectively coupled to the reference voltage prior to measuring the voltage difference experienced at the delta node of the PCUT.

2. The method of claim 1, wherein the capturing the voltage difference comprises:
amplifying, by the amplifier, the voltage difference for the determining operability of at least a portion of the PCUT.

3. The method of claim 1, wherein the delta node comprises a node identified as experiencing a voltage change in association with the PCUT changing from a first state of the programmability to a second state of the programmability.

4. The method of claim 3, wherein the delta node is identified through simulation.

5. The method of claim 3, wherein the delta node is identified through empirical analysis.

6. The method of claim 1, wherein the delta node comprises a test node created to provide a voltage change in association with the PCUT changing from a first state of the programmability to a second state of the programmability.

7. The method of claim 1, wherein determining operability of at least a portion of the PCUT based upon information regarding the captured voltage difference comprises:
determining if a voltage difference was captured.

8. The method of claim 7, further comprising:
setting an error flag if no voltage difference is observed.

9. The method of claim 7, further comprising:
setting a success flag if a voltage difference is observed.

10. The method of claim 1, further comprising:
converting the captured voltage difference to a digital signal used in the determining operability of at least a portion of the PCUT.

11. The method of claim 10, wherein the converting the captured voltage different to a digital signal is performed using an analog to digital converter having a resolution of 8 bits or less.

12. The method of claim 10, wherein circuitry operable to perform the capturing the voltage difference, the converting the captured voltage difference to a digital signal, and the determining operability of at least a portion of the PCUT is disposed upon a same integrated circuit substrate as the PCUT.

13. A system for testing programmability of a programmable circuit under test, the system comprising:
a delta probe circuit coupled to a delta node of the programmable circuit under test (PCUT), the delta probe circuit having circuitry adapted to capture a voltage difference experienced at the delta node in association with the PCUT changing from a first state of the programmability to a second state of the programmability; and a test controller circuit adapted to control the delta probe circuit to receive information regarding the voltage difference experienced at the delta node in synchronization with operation of the PCUT changing from the first state of the programmability with a first control code to the second state of the programmability with a second control code, and to provide a determination regarding operability of the programmability of the PCUT based upon the voltage difference information, wherein the delta probe circuit comprises:

an amplifier having a first input terminal, a second input terminal connected to a reference voltage, and an output terminal;

a first capacitor having a first terminal selectively coupled between the delta node of the PCUT and an open circuit by a switch, and a second terminal coupled to the first input terminal of the amplifier; and a second capacitor having a first terminal coupled to the first input terminal of the amplifier and a second terminal coupled to the output terminal of the amplifier, and wherein the first input terminal of the amplifier and the output terminal of the amplifier are selectively coupled to the reference voltage prior to measuring the voltage difference experienced at the delta node of the PCUT.

14. The system of claim 13, wherein the first capacitor and the second capacitor of the delta probe circuit comprise a switched capacitor circuit configuration adapted to capture the voltage difference.

15. The system of claim 13, wherein the amplifier comprising the delta probe circuit is adapted to provide gain with respect to the captured voltage difference.

16. The system of claim 13, wherein the delta node comprises a node identified as experiencing a voltage change in association with the PCUT changing from a first state of the programmability to a second state of the programmability.

17. The system of claim 13, wherein the delta node comprises a test node created to provide a voltage change in association with the PCUT changing from a first state of the programmability to a second state of the programmability.

18. The system of claim 13, wherein the test controller comprises a digital state machine.

19. The system of claim 13, wherein the determination regarding operability of the programmability of the PCUT comprises an error flag if no voltage difference is observed.

20. The system of claim 13, further comprising:

an analog to digital converter coupling the delta probe circuit to the test controller circuit, wherein the voltage difference captured by the delta probe is converted to digital information regarding the voltage difference.

21. The system of claim 20, wherein the analog to digital converter comprises a relatively low resolution analog to digital converter.

22. The system of claim 21, wherein the relatively low resolution is 8 bits or less.

23. The system of claim 20, wherein the delta probe, the analog to digital converter, and the test controller circuit are disposed upon the same integrated circuit substrate.

24. The system of claim 23, wherein the programmable circuit under test is disposed upon the same integrated circuit substrate.

25. A system comprising:

a delta probe circuit adapted to capture a voltage difference experienced at a delta node of a programmable circuit under test (PCUT) in synchronization with the PCUT changing from a first state of programmability to a second state of programmability;

an analog to digital converter coupled to the delta probe circuit and operable to convert the voltage difference captured by the delta probe circuit to digital information regarding the voltage difference; and a test controller circuit operable to:

control changing of the PCUT from the first state of programmability with a first control code to the second state of programmability with a second control code, and receive the information regarding the voltage difference and to provide a determination regarding operability of the programmability of the PCUT based upon the voltage difference information, wherein the delta probe circuit comprises:

an amplifier having a first input terminal, a second input terminal connected to a reference voltage, and an output terminal;

a first capacitor having a first terminal selectively coupled between the delta node of the PCUT and an open circuit by a switch, and a second terminal coupled to the first input terminal of the amplifier; and a second capacitor having a first terminal coupled to the first input terminal of the amplifier and a second terminal coupled to the output terminal of the amplifier, and wherein the first input terminal of the amplifier and the output terminal of the amplifier are selectively coupled to the reference voltage prior to measuring the voltage difference experienced at the delta node of the PCUT.

26. The system of claim 25, wherein the delta node comprises a node identified as experiencing a voltage change in association with the programmable circuit under test changing from a first state of the programmability to a second state of the programmability.

27. The system of claim 25, wherein the amplifier, the first capacitor, and the second capacitor of the delta probe circuit comprise a difference and gain stage circuit configuration.

28. The system of claim 27, wherein the difference and gain stage configuration of the delta probe circuit is a switched capacitor circuit configuration adapted to capture the voltage difference.

29. The system of claim 28, wherein the amplifier comprising the difference and gain stage configuration of the delta probe circuit is adapted to provide gain with respect to the captured voltage difference.

30. The system of claim 25, wherein the test controller comprises a digital state machine.

31. The system of claim 25, wherein the analog to digital converter comprises an analog to digital converter having a resolution of 8 bits or less.

32. The system of claim 25, wherein the delta probe, the analog to digital converter, and the test controller circuit are disposed upon the same integrated circuit substrate.

33. The system of claim 32, wherein the programmable circuit under test is disposed upon the same integrated circuit substrate.

* * * * *